(12) United States Patent
Kruwinus et al.

(10) Patent No.: US 6,627,548 B1
(45) Date of Patent: Sep. 30, 2003

(54) PROCESS FOR TREATING SEMICONDUCTOR SUBSTRATES

(75) Inventors: Hans-Jürgen Kruwinus, Bodensdorf (AT); Geert De Nijs, München (DE)

(73) Assignees: SEZ Semiconductor-Equipment Zubehor fur die Halbleiterfertigung AG, Villach (AT); Infineon Technologies AG, Müchen (DE)

( * ) Notice: Subject to any disclaimer, the term of this patent is extended or adjusted under 35 U.S.C. 154(b) by 64 days.

(21) Appl. No.: 09/617,500

(22) Filed: Jul. 17, 2000

(30) Foreign Application Priority Data

Jul. 15, 1999 (AT) .............................................. 1233/99

(51) Int. Cl.$^7$ .............................................. H01L 23/48
(52) U.S. Cl. .............................. 438/689; 438/8; 438/9; 438/622; 438/695; 438/704; 438/706; 438/745; 156/345
(58) Field of Search ................................ 438/8–9, 622, 438/689–757; 156/345

(56) References Cited

U.S. PATENT DOCUMENTS

| | | | |
|---|---|---|---|
| 5,266,525 A | | 11/1993 | Morozumi |
| 5,384,271 A | | 1/1995 | Kwasnick |
| 5,409,861 A | * | 4/1995 | Choi ........................... 437/195 |
| 5,433,823 A | | 7/1995 | Cain |
| 5,466,631 A | * | 11/1995 | Ichikawa et al. .............. 437/62 |
| 5,490,901 A | | 2/1996 | Kim |
| 5,543,648 A | * | 8/1996 | Miyawaki ................... 257/347 |
| 5,619,064 A | | 4/1997 | Cho |
| 5,633,175 A | | 5/1997 | Kikuchi |
| 5,670,426 A | * | 9/1997 | Kuo et al. ................... 437/195 |
| 5,731,243 A | * | 3/1998 | Peng et al. .................. 438/612 |
| 5,756,376 A | | 5/1998 | Sheng |
| 5,824,234 A | | 10/1998 | Jou |
| 5,911,887 A | | 6/1999 | Smith |
| 6,117,783 A | * | 9/2000 | Small et al. .................. 438/693 |
| 6,121,117 A | * | 9/2000 | Sato et al. ................... 438/459 |
| 6,124,179 A | * | 9/2000 | Adamic, Jr. .................. 438/309 |
| 6,127,279 A | * | 10/2000 | Konuma ...................... 438/745 |
| 6,267,122 B1 | * | 7/2001 | Guldi et al. ................... 134/1.3 |
| 6,274,059 B1 | * | 8/2001 | Krusell et al. ................. 216/88 |
| 6,276,205 B1 | * | 8/2001 | McNie et al. ............. 73/504.13 |
| 6,331,476 B1 | * | 12/2001 | Kawakita et al. ............ 438/486 |
| 6,332,988 B1 | * | 12/2001 | Berger, Jr. et al. ........... 216/100 |

FOREIGN PATENT DOCUMENTS

| | | | | |
|---|---|---|---|---|
| DE | 196 26026 A1 | | 1/1997 | |
| DE | 1069604 | * | 7/1999 | ......... H01I/21/311 |
| EP | 0 444 714 B1 | | 9/1991 | |
| EP | 0 523 856 A2 | | 1/1993 | |
| EP | 001069604 | * | 7/2000 | ......... H01L/21/311 |
| JP | 63-289938 | * | 11/1988 | ......... H01L/21/306 |
| JP | 4-342133 | * | 11/1992 | ......... H01L/21/306 |

OTHER PUBLICATIONS

Abstract of Japanese published patent application No. 62092218, dated Apr. 14, 1987 (publication No. 63257229, dated Oct. 25, 1988).

Abstract of JP7037780, dated Feb. 7, 1995.

* cited by examiner

*Primary Examiner*—Matthew Smith
*Assistant Examiner*—Granvill D Lee, Jr.
(74) *Attorney, Agent, or Firm*—Bacon & Thomas

(57) ABSTRACT

The invention relates to a process for treating semiconductor substrates in which metal layers are exposed by removing one or more layers of the surface of a semiconductor substrate which have been applied to the metal layer, in which exposure takes place in a time sequence to a first part of the layer by a dry etching step and to a second part of the layer by a wet etching step.

21 Claims, No Drawings

PROCESS FOR TREATING SEMICONDUCTOR SUBSTRATES

The invention relates to a process for treating semiconductor substrates in which metal surfaces are exposed.

The metal surfaces can be bonding pads which are located on the surface of semiconductor chips. These bonding pads are used in the production of integrated circuits for connection to wires (for example, fine gold wires) which in turn are connected to the external circuit or other electronic or electrical components.

These bonding pads are produced in the so-called "back and forth" area of semiconductor production.

The metal surfaces (metal layers) which are designed to represent the bonding pads of the semiconductor chips are coated with a passivation layer, like the remaining surface of the chip. This passivation layer is used for insulation and protection of the semiconductor structures against impurities, moisture, mechanical failure and other ambient influences, such as particle radiation.

This passivation layer consists in the simplest case of a layer, conventionally silicon dioxide or silicon nitride. Ordinarily it has a two-layer structure, the layer which is applied first and which faces the metal layer is then usually silicon dioxide and the second layer is usually silicon nitride. Another layer as part of the passivation layer can be applied over these two layers, for example, a polyimide layer which is used as an additional protective layer especially against particle radiation from the environment.

Often it is distinguished between a first layer which is located on the metal layer (thickness 0.3–3 microns, U.S. Pat, No. 5,911,887) which is then called the insulator or dielectric layer, and a second layer which is located on the dielectric layer (thickness 0.3–3 microns U.S. Pat. No. 5,911,887) which is then called the actual passivation layer.

Between the metal layer and the passivation layer or the dielectric layer a so-called anti-reflex coating (ARC) can have been applied in a thickness of 5–250 nm (U.S. Pat. No. 5,911,887). This layer is then used to enable or facilitate exposure in photolithographic treatment. This anti-reflex coating can consist for example of titanium, titanium nitride or titanium-tungsten.

In addition, between the metal layer and the anti-reflex coating or the passivation layer also a so-called etch stop layer in a thickness of 6–250 nm can have been applied (U.S. Pat. No. 5,911,887). This layer is used to greatly reduce the etching rate when this layer is reached so that the underlying metal layer is not attacked. The etch stop layer can at the same time assume the function of the anti-reflex coating.

Furthermore, between the metal layer and the passivation layer or when present the anti-reflex coating and the passivation layer a so-called diffusion barrier layer (U.S. Pat. No. 5,756,376) can be applied.

To structure or expose the bonding pads or metal layers a photoresist is applied to the uppermost of the aforementioned layers and after exposure, developing or hardening, it is used as an etching mask. If the uppermost layer is for example a photosensitive polyimide, after exposure of the metal layers it plays the part of an additional passivation layer and need not be removed.

The bonding pads can have a size of for example 100×100 microns with a distance from one another of 50 to 100 microns (U.S. Pat. No. 5,433,823).

U.S. Pat. No. 5,443,823 mentions that surfaces of this magnitude can be wet etched, but dry etching is preferred. The reason for preferring dry etching is that layers of this thickness (up to greater than 1 micron) can be removed either only slowly with high chemical consumption or with very aggressive etching solutions. Moreover there is the danger that etching takes place under the photoresist (hardened photoresist). How wet etching could take place for exposing the bonding pads is not mentioned in U.S. Pat. No. 5,443,823. A dry etching process for the passivation layer (here silicon nitride on silicon dioxide) is described which is designed to have high selectivity against the photoresist (hardened photoresist) and against the diffusion barrier layer or anti-reflex coating (here titanium-tungsten).

U.S. Pat. No. 5,824,234 describes a process for producing bonding pads, etching of the layers located over the metal surface taking place for exposing the metal surfaces using a fluorine-containing gas by reactive ion etching or plasma etching. The resulting fluorine-containing layers represent unwanted contamination since they increase the ohmic resistance of contact. These contaminants can on the one hand be fluorine-containing polymers and on the other metal fluorides (for example $AlF_3$). Cleaning of the bonding pads or the removal of the impurities is done by immersion of the wafers in a cleaning solution. The cleaning solution is an aqueous basic solution; it contains for example tetramethyl ammonium hydroxide (TMAH).

U.S. Pat. No. 5,911,887 proposes different superstructures of the layers over the bonding pad, and an etch stop layer which can at the same time be an anti-reflex coating is offered. The passivation layer and the dielectric layer are removed in a first dry etching step (plasma etching or reactive ion etching). This etching step which hardly attacks the etch stop layer is carried out with fluorine-containing etching gases (for example, $C_2F_6$ and/or $CHF_3$). In a second etching step the etch stop layer is removed and thus the metal layer is exposed. This second etching step is likewise a dry etching step which may not use any carbon-containing gases to prevent formation of polymers. Examples include among others $Cl_2$, $HCl$ or $SF_6$.

Even if no polymers form on the metal surface, when using fluorine-containing gases at least the metal fluorides (for example $AlF_3$) described in U.S. Pat. No. 5,824,234 form or when using chlorine-containing gases a metal chloride (for example $AlCl_3$) forms. The metal halides must then be removed or converted.

U.S. Pat. No. 5,731,243 describes that the polymers which remain after exposing the metal layer of the bonding pad in the vicinity of the bonding pads are removed wet-chemically. The solutions used contain for example dimethyl sulfoxide and monoethanol amine. This step takes place here before thin grinding of the wafer, during which the surface of the wafer on which the structures are located is protected using a self-adhesive film. The removal of the polymers before thin grinding is intended to prevent the remainder of the film from adhering to the polymers and thus highly contaminating the bonding pads.

This disadvantages of the above described impurities on the bonding pads can be: a high ohmic resistance of the contact with a wire, poor adhesive strength of the wire on the bonding pad or lack of contact with contact elements of a test means during testing. In the latter case it can lead to an actually serviceable semiconductor chip being discarded as bad because only the bonding pads are contaminated.

The object of the invention was to make available a simplified, shortened process for exposing a metal layer, according to which the bonding pads are free of impurities at the same time.

As claimed in the invention, a process is proposed for at least partial exposure of a metal layer by removing one or more layers of the surface of a semiconductor substrate which have been applied to the metal layer, in which the exposure takes place in a time sequence to a first part of the layer by a dry etching step and to a second part of the layer by a wet etching step.

In this way the by-products which have formed in the dry etching step cannot be deposited directly on the metal layer. Rather they are deposited at least in part on the second part of the layer which has not yet been removed after the end of the dry etching step. This second part is now removed by a wet etching step, by which at the same time the by-products or the residues of the dry etching step are removed at the same time.

Other process steps can also be carried out between the two etching steps. The remaining part of the layer thus assumes the function of a protective layer during the other process steps.

The first part of the layer which has been removed with the dry etching step can be more than 80% or even more than 90% of the originally applied layer. Because this step is carried out with conventionally high speed dry etching processes, complete removal (removal of the layer which has been applied over the metal layer) can be kept economical.

The second part of the layer which is smaller in this case can then be removed with a slow wet etching process since only little more need be removed. Or it is done with a high speed wet etching process, since as a result of the smaller remaining layer thickness the uniformity which can otherwise only be achieved with difficulty represents a lesser problem.

The exposed metal layers can be any type of bonding pads, i.e. for the formation of via holes between two metallization planes or also bonding pads which are used to connect the semiconductor to the wires.

The process as claimed in the invention yields an advantage when the metal layers to be exposed are bonding pads which are used to connect the semiconductor to wires, since in this case relatively large surfaces must be exposed.

In one embodiment of the process as claimed in the invention, the first part of the layer consists of a first material and the second part consists of a second material, and the first material differs from the second material.

This enables the dry etching step to be stopped essentially immediately after the first part of the layer is removed. This can take place either by an end point detection system or by the second layer hardly being attacked by the dry etching step.

In another embodiment of the process as claimed in the invention the parameters of the dry etching step are chosen such that the first part of the layer is attacked more strongly than the second part of the layer, by which the etching rate is reduced. This can take place among others by choosing a suitable temperature, a suitable pressure or suitable composition of the etching gas mixture.

Suitable processes for the dry etching step can be chosen from the group plasma etching, reactive ion etching, and electron beam etching. Plasma etching has been found to be advantageous.

According to one embodiment of the process, the etching medium of the dry etching step contains a fluorine-containing gas. This is especially advantageous when the first part of the layer to be removed consists of a silicon-containing nonconductor, for example silicon dioxide and/or silicon nitride.

According to another embodiment of the process, the etching medium of the dry etching step also contains oxygen in addition to the fluorine-containing gas. This is advantageous when the first part of the layer to be removed consists of silicon nitride.

If the parameters of the wet etching step are chosen such that the second part of the layer is more strongly attacked than the first part of the layer, the remaining side walls of the first part which were formed after dry etching of the first part of the layer are not etched by the liquid of the wet etching step. The parameters to be set can be among others the temperature, flow speed and concentration of the components and the choice of the solvent of the etching liquid.

Possible wet etching processes are immersion processes, spray etching processes and rotation processes, or a combination thereof. An immersion process is defined as a process in which one or a host of wafers are immersed completely into a liquid, in doing so the liquid can also flow pass the surfaces of the wafer(s). In a spray etching process the liquid is sprayed onto the surfaces, and the wafers can also rotate at the same time.

A rotation etching process, also spin etch process, is defined as a process in which the etching liquid is applied to at least one surface of the wafer in a continuous flow without atomization of the liquid, while it is rotating and the liquid is flung off over the peripheral-side edge of the wafer.

A rotation etching process is advantageous in which the wafers are treated individually one after another, as is described for example in EP 0 444 714 B1.

In one embodiment of the process as claimed in the invention, the etching agent of the wet etching step is an aqueous solution. This entails among others the advantage that the used etching solution can be disposed of more easily.

Advantageously the etching agent of the wet etching step contains an oxidation agent, especially when the second part of the layer to be removed contains a metal (for example, Ti), an alloy (for example, TiW) or a non-oxide metal compound (for example, TiN).

Good results were achieved with an acid solution. An etching agent which contains nitric acid and hydrofluoric acid proved advantageous, easily reproducible results being obtained when the molar ratio of $HNO_3$:HF is in the range 3:1 to 1000:1.

Results are also good with basic solutions to remove the second part of the layer. One advantageous etching agent contains ammonia or an amine and hydrogen peroxide.

Another part of the invention is a process for thinning of wafers in which the dry etching step for removing the first part of a layer is done to expose the second part of a layer before thinning and the wet etching step is done to remove the second part of the layer to expose a metal layer after thinning.

Thinning is done for example by mechanical thin grinding of the back, immediately before grinding a film being applied to the surface of the wafer which bears the structures for their protection. Immediately after grinding, the film is removed again. Then the surface from which the film has been removed is subjected to the wet etching step by which an additional cleaning step for removal of the adhesive residue of the film can be eliminated.

Other details of the invention follow from the example below.

On the surface of a silicon wafer which is intended to bear the structures, bonding pads will be formed which are later to be connected to gold wires. To do this the following layers are applied in the following sequence:

(1) a 600 nm thick aluminum layer which is structured according to the later arrangement of the bonding pads,
(2) a 20 nm thick titanium layer as the anti-reflex coating,
(3) a 30 nm thick titanium nitride layer as the diffusion barrier layer, (4) a 300 nm thick silicon dioxide layer using plasma as part of the passivation layer, (5) a 500 nm thick silicon nitride layer using plasma as part of the passivation layer, (6) a photosensitive polyimide layer by spin-coating which is structured accordingly, the areas over the later bonding pads being removed.

At this point plasma etching treatment with a gas mixture of carbon tetrafluoride and oxygen takes place, the silicon nitride layer and the silicon dioxide layer being removed. When the titanium nitride layer is reached the etching rate drops dramatically, and the plasma etching step is ended.

Then, to remove the titanium nitride and the titanium the surface is treated with an aqueous solution of nitric acid (c=10 mole/l) and hydrofluoric acid (c=3 mole/l) on a SEZ Spin Processor 203 with a rotational speed of 500 rpm (T=25 C, volumetric flow: 15 l/min). The back is flushed with nitrogen during the process. When the aluminum layer is exposed, which is indicated by an end point detection system, application of the etching liquid is stopped and immediately after the etching liquid is spun off, it is flushed with deionized water and dried.

The aluminum layer can be selectively conditioned by slight controlled overetching, this taking place by defined removal of the aluminum (roughly 20 nm).

What is claimed is:

1. A process for at least partial exposure of a metal surface on the surface of a semiconductor substrate by erosive removal of at least one layer which has been applied to the metal surface, wherein the metal surface to be exposed comprises bonding pads which are used to connect the semiconductor substrate to wires, characterized in that in a time sequence a first part of said at least one layer is removed by dry etching and then a second part of said at least one layer is removed by wet etching wherein said wet etching is rotation etching in which the semiconductor substrates are treated individually in succession.

2. A process for at least partial exposure of a metal surface on the surface of a semiconductor substrate by erosive removal of at least one layer which has been applied to the metal surface, wherein the metal surface to be exposed comprises bonding pads which are used to connect the semiconductor substrate to wires, characterized in that in a time sequence a first part of said at least one layer is removed by dry etching and then a second part of said at least one layer is removed by wet etching; with the provisos that said wet etching is chosen from the group consisting of immersion etching, spray etching and rotation etching, and said etching agent is an aqueous solution containing nitric acid and hydrofluoric acid wherein the molar ratio of $HNO_3$:HF is in the range from 2:1 to 1000:1.

3. A process for thinning of a semiconductor substrate which comprises at least partially exposing a metal surface on a surface of said substrate by erosive removal of at least one layer which has been applied to the metal surface, wherein the metal surface to be exposed comprises bonding pads which are used to connect the semiconductor substrate to wires, characterized in that in a time sequence a first part of said at least one layer is removed by dry etching, said substrate is subjected to a thinning process to reduce the thickness of said substrate and then a second part of said at least one layer is removed by wet etching after said thinning process.

4. The process as claimed in claims 1, 2 or 3, wherein with dry etching more than 80% of said at least one layer, is removed.

5. The process as claimed in claims 1, 2, or 3, wherein the first part of said at least one layer consists of a first material and the second part of said at least one layer consists of a second material, and the first material differs from the second material.

6. The process as claimed in claim 5, wherein the first part of said at least one layer is attacked more strongly than the second part of said at least one layer during dry etching.

7. The process as claimed in claims 1, 2 or 3, wherein dry etching is chosen from the group consisting of plasma etching, reactive ion etching, and electron beam etching.

8. The process as claimed in claim 7, wherein plasma etching is done as dry etching.

9. The process as claimed in claims 1, 2 or 3, wherein in dry etching an etching medium is used which contains a fluorine-containing gas.

10. The process as claimed in claim 9, wherein in dry etching an etching medium is used which contains oxygen.

11. The process as claimed in claims 1, 2 or 3, wherein the second part of said at least one layer is more strongly attacked than the first part of said at least one layer during wet etching.

12. The process of claims 1, 2 or 3 wherein dry etching removes more than 90% of said at least one layer.

13. The process as claimed in claims 3, wherein wet etching is chosen from the group consisting of immersion etching, spray etching and rotation etching.

14. The process as claimed in claim 13, wherein the wet etching is rotation etching in which the semiconductor substrates are treated individually in succession.

15. The process as claimed in claim 13, wherein the etching agent is an aqueous solution.

16. The process as claimed in claim 15, wherein the etching agent contains an oxidant.

17. The process as claimed in claim 15, wherein the etching agent is an acid solution.

18. The process as claimed in claim 17, wherein the etching agent contains nitric acid and hydrofluoric acid.

19. The process as claimed in claim 18, wherein tile molar ratio of $HNO_3$:HF is in the range from 2:1 to 1000:1.

20. The process as claimed in claim 15, wherein the etching agent is a basic solution.

21. The process as claimed in claim 20, wherein the etching agent contains ammonia or an amine and hydrogen peroxide.

* * * * *